(12) United States Patent
Sunter

(10) Patent No.: US 6,885,213 B2
(45) Date of Patent: Apr. 26, 2005

(54) CIRCUIT AND METHOD FOR ACCURATELY APPLYING A VOLTAGE TO A NODE OF AN INTEGRATED CIRCUIT

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/634,902

(22) Filed: Aug. 6, 2003

(65) Prior Publication Data
US 2004/0051551 A1 Mar. 18, 2004

Related U.S. Application Data

(60) Provisional application No. 60/410,270, filed on Sep. 13, 2002.

(51) Int. Cl.[7] .............................................. G01R 31/26
(52) U.S. Cl. ....................................... 324/765; 324/763
(58) Field of Search ................................. 324/763, 765, 324/158.1, 760, 73.1; 714/738, 736, 734

(56) References Cited

U.S. PATENT DOCUMENTS

| | | |
|---|---|---|
| 4,646,299 A | 2/1987 | Schinabeck et al. |
| 5,059,889 A | 10/1991 | Heaton |
| 5,610,530 A | 3/1997 | Whetsel |
| 5,617,035 A | 4/1997 | Swapp |
| 5,644,261 A | 7/1997 | Frisch et al. |
| 5,673,277 A | 9/1997 | Amitai et al. |
| 5,872,908 A | 2/1999 | Whetsel |
| 5,968,191 A | 10/1999 | Thatcher et al. |
| 6,255,839 B1 * | 7/2001 | Hashimoto .................. 324/765 |
| 6,313,657 B1 * | 11/2001 | Hashimoto .................. 324/763 |
| RE37,500 E | 1/2002 | Lee |
| 6,397,361 B1 | 5/2002 | Saitoh |
| 6,404,220 B1 * | 6/2002 | Hashimoto .................. 324/765 |
| 6,492,798 B1 | 12/2002 | Sunter |
| 2001/0013790 A1 | 8/2001 | Kusumoto |

* cited by examiner

Primary Examiner—David Zarneke
Assistant Examiner—Tung X. Nguyen
(74) Attorney, Agent, or Firm—Eugene E. Proulx

(57) ABSTRACT

A method for accurately delivering a voltage to a circuit node of an integrated circuit having analog buses and transmission gates selectively connecting the circuit node to the buses, comprises sensing the voltage on the circuit node via a first of the buses under control of a first periodic signal; applying a first stimulus voltage to the circuit node via a second bus under control of a second periodic signal; and applying a second stimulus voltage to the circuit node under control of a third periodic signal which is inverted with respect to the second periodic signal so that the circuit node is driven alternately to the first stimulus voltage and to the second stimulus voltage.

10 Claims, 6 Drawing Sheets

US 6,885,213 B2

CIRCUIT AND METHOD FOR ACCURATELY APPLYING A VOLTAGE TO A NODE OF AN INTEGRATED CIRCUIT

CROSS-REFERENCE TO RELATED APPLICATIONS

This application claims the benefit of U.S. Provisional Patent Application Ser. No. 60/410,270 filed Sep. 13, 2002.

BACKGROUND OF THE INVENTION

1. Field of the Invention

The present invention generally relates to the design and testing of integrated circuits (ICs), and, more specifically, to a method and circuit for accurately delivering DC or AC voltage to circuit nodes of integrated circuits.

2. Description of Related Art

Automatic Test Equipment (ATE) typically includes a parametric measurement unit (PMU) to measure the drive of an output pin of an IC, or to accurately deliver a DC voltage to an IC pin. The output drive of a pin is tested by applying a known current to the pin and measuring the resultant voltage at the pin, or by applying a known voltage and measuring the resultant current. FIG. 1 shows a simple IC 10, having pins 12 and 14, mounted on a device interface board 16 associated with test equipment 22. A DC stimulus voltage 18 is accurately delivered to pin 12 of the IC by applying (forcing) the stimulus voltage via first conductive path 20 of test equipment 22, and sensing the applied voltage via a second conductive path 24 of the test equipment. Typically, an operational amplifier 26 is used to adjust the applied voltage until the sensed voltage is equal to the desired voltage. A capacitor 64 is typically included to improve the stability of the operational amplifier. The aforementioned conductive paths typically comprise wires, board-to-board interface connectors, and electromechanical relays 28. FIG. 2 illustrates a similar arrangement for testing a circuit 30 having differential pins 32, 34. In this case, the arrangement uses a differential amplifier 36. While these arrangements succeed in accurately delivering a desired voltage to an IC pin, it does not deliver the desired voltage to the circuit node of interest within the circuit. More specifically, the arrangements do not accommodate voltage drops which may occur between the IC pin and the node of interest. It also does not provide a way of applying a high frequency voltage signal.

Saitoh U.S. Pat. No. 6,397,361, granted on May 28, 2002, for "Reduced pin Integrated Circuit I/O Test", describes force/measure paths of a tester which converge on a single FM (force/measure) pad of an IC under test. The pad is connected to a single, on-chip wire bus that is connected, via transmission gate switches, to other pins of the IC so that they may be tested without mechanically probing them. The tester forces a current and measures a voltage, or, alternatively, forces a voltage and measures a current. If the transmission gates have significant series impedance, for example comparable to the impedance of the pull-up resistance of the pin, then the pin cannot be accurately driven to a stimulus voltage because of the unknown voltage drop across the transmission gate. The patent also shows the addition of a second bus to allow access to differential pin pairs that are inputs to a differential receiver so that two pins can be driven simultaneously. Saitoh is not concerned with and does not provide a method of accurately delivering a voltage to a circuit node within the circuit.

SUMMARY OF THE INVENTION

An objective of the present invention is to provide a method and a circuit for accurately delivering a voltage, DC or AC, to IC circuit nodes that have significant impedances to ground, via common buses and transmission gates that have significant series impedance.

A further objective of the present invention is to provide a method and a circuit for accurately delivering high frequency AC voltages to circuit nodes by applying a low frequency to a common bus and switching at a high frequency, at the circuit node, between a low frequency bus signal and some other signal.

The present invention also seeks to provide signal delivery in a way that is compliant with the IEEE 1149.1 and 1149.4 test access standards.

The test method of the present invention is applied to an IC that has at least two analog bus pins and on-chip buses connected thereto, and digitally-controlled transmission gates connecting the on-chip buses to a circuit node that is to be accurately driven to a stimulus voltage with the voltage originating in a tester having an operational amplifier, a voltage force path, a voltage sense path, and a capacitor between the force and sense paths; wherein the force path is connected to one of the on-chip buses, and the sense path is connected to another of the on-chip buses, and the transmission gates are selectably enabled to allow the force path connected bus and the sense path connected bus to each connect directly to the circuit node. The voltage of the circuit node is driven so that the voltage detected via the sense path becomes equal to the stimulus voltage. If a voltage stimulus having a high frequency that is too high to be conveyed via the on-chip bus is needed, then the transmission gates connected directly to the circuit node are enabled periodically at the high frequency while the force path is driven with a low frequency voltage (including DC) and the sense path conveys this same low frequency.

One aspect of the present invention is generally defined as a method for accurately delivering a voltage to a circuit node of an integrated circuit having analog buses and transmission gates selectively connecting the circuit node to the buses, comprising: sensing the voltage on the circuit node via a first of the buses under control of a first periodic signal; applying a first stimulus voltage to the circuit node via a second bus under control of a second periodic signal; applying a second stimulus voltage to the circuit node under control of a third periodic signal which is inverted with respect to the second periodic signal so that the circuit node is driven alternately to the first stimulus voltage and to the second stimulus voltage.

Another aspect of the present invention is generally defined as a circuit for accurately delivering a first stimulus voltage to one or more circuit nodes of an IC, the circuit comprising switching means, within the IC, for conveying a force voltage to one of the circuit nodes; switching means, within the IC, for conveying a sense voltage from the one of the circuit nodes; amplifier means for adjusting the force voltage to cause the sense voltage to equal the stimulus voltage; storage means for storing a voltage difference between the force voltage and the sense voltage; and means for selectively simultaneously enabling both of the switching means to enable the first stimulus voltage to be delivered to the one of the circuit nodes.

BRIEF DESCRIPTION OF THE DRAWINGS

These and other features of the invention will become more apparent from the following description in which reference is made to the appended drawings in which.

DETAILED DESCRIPTION OF EMBODIMENTS OF THE INVENTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As mentioned earlier, a primary objective of the present invention is to accurately deliver a stimulus voltage to a circuit node, which may be a bond pad of an integrated circuit and which may have significant impedance to ground, via a common bus so that mechanical connection to the circuit node is unnecessary. A further objective is to provide means for accurately delivering a stimulus voltage that has a frequency that is too high for the common bus. Another objective is facilitating reduced pin count access to an IC during manufacturing test of the IC.

Figure 3:
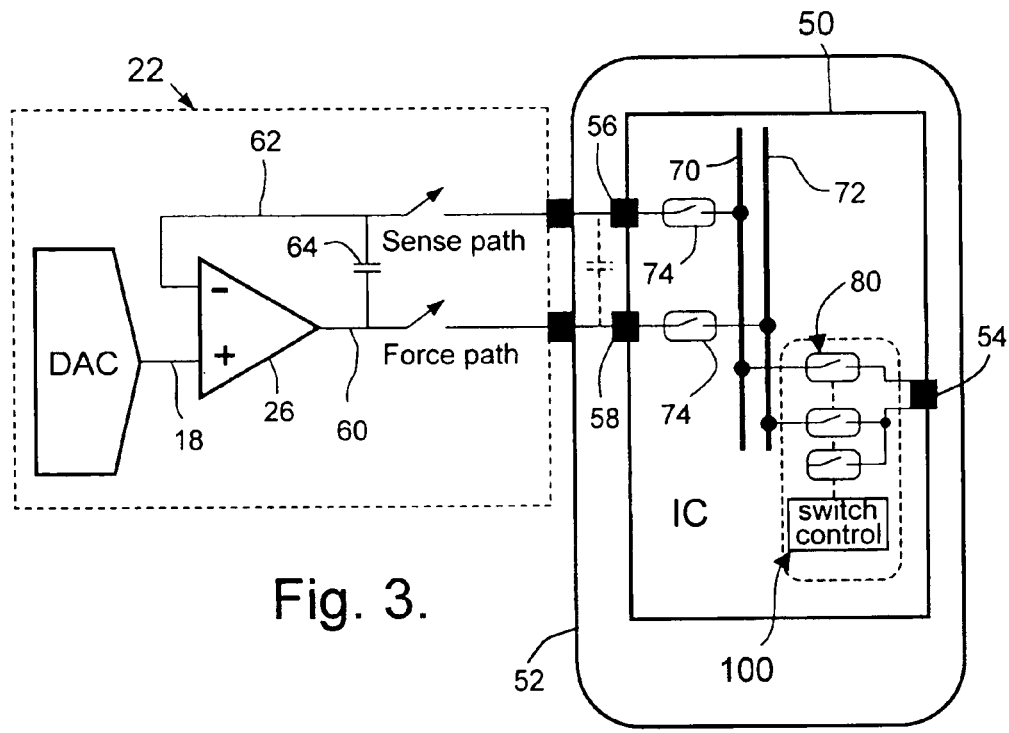
FIG. 3 is a circuit schematic of a tester signal source connected to an integrated circuit that has two analog buses and transmission gates connected to circuit nodes and a switch control circuit according to an embodiment of the present invention.

FIG. 3 illustrates an integrated circuit 50 mounted on a device interface board 52 associated with tester 22. The circuit has a circuit node 54 that is to be accurately driven to a stimulus voltage. The circuit also has terminals 56 and 58 which connect to terminals of the tester via terminals of the interface board. As previously described with reference to FIG. 1, a stimulus voltage 18 originates in tester 22 and is applied to one input of op-amp 26. The output of the op-amp is connected to circuit pin 58 and defines a voltage force path 60. Circuit pin 56 is connected to the other input of op-amp 26 to define a voltage sense path 62. A capacitor 64 is provided between force path 60 and sense path 62 and is used by the present invention for storing a voltage difference between the force voltage and the sense voltage.

IC 50 is provided with on-chip analog buses 70 and 72, preferably, analog buses as described in the IEEE 1149.4 standard. Pins 56 and 58 are bus access pins AT1, AT2, described later, which are connected to on-chip buses 70 and 72 by switches 74 provided by a Test Bus Interface Circuit (TBIC). Circuit node 54, that is to be accurately driven to a stimulus voltage, is connected to each of analog buses 70 and 72 by means of digitally-controlled transmission gates 80. Transmission gates 74 and 80 are selectably enabled to allow force path connected bus 72 and sense path connected bus 70 to each connect directly to circuit node 54.

The series impedance of transmission gates 74 and 80 does not affect the accuracy of the delivered signal if the force voltage in force path 60 provided by the tester does not exceed the maximum voltage tolerated by the IC. For example, if the series impedance is 1000 ohms, the circuit node's impedance to ground is 1000 ohms, and the maximum stimulus voltage tolerated is 4 volts, then the maximum voltage that can be delivered to the circuit node is 2 volts.

Each of transmission gates 80 is enabled by a bit in a digital shift register element (not shown), which, in a preferred embodiment of the present invention, is part of an 1149.1 boundary scan register (BSR). The present invention provides a switch control circuit 100, shown in more detail in FIG. 7, which combines BSR bit values with a clock signal to provide accurate delivery of a low or high frequency voltage to circuit node 54.

In general, the present invention provides a circuit for accurately delivering a first stimulus voltage to one or more circuit nodes of an IC. The circuit comprises switching means, within the IC, for conveying a force voltage to one of the circuit nodes; switching means, within the IC, for conveying a sense voltage from the one of the circuit nodes; amplifier means for adjusting the force voltage to cause the sense voltage to equal the stimulus voltage; storage means for storing a voltage difference between the force voltage and the sense voltage; and means for selectively simultaneously enabling both of the switching means to enable the first stimulus voltage to be delivered to the one of the circuit nodes. The amplifier means and/or the storage means may be on the IC or on a tester.

Figure 4:
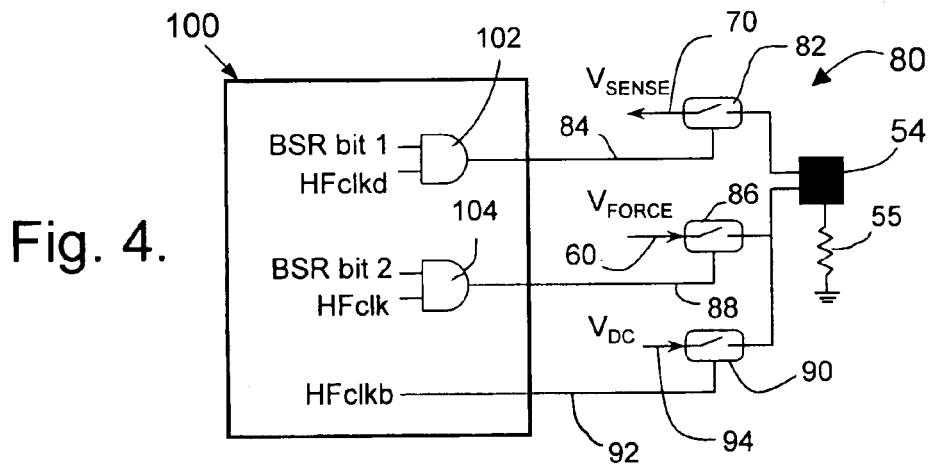
FIG. 4 is a more detailed circuit schematic of a switch control circuit according to an embodiment of the present invention.

Referring to FIG. 4, transmission gates 80 comprise a first switching means in the form of a first transmission gate 82 which has an input connected to circuit node 54, an output connected to bus 70, and a control input 84 connected to control circuit 100, a second switching means in the form of a transmission gate 86 which has an output connected to circuit node 54 and an input connected to bus 72, and a control input 88 connected to control circuit 100, and a third switching means in the form of a transmission gate 90 which has an output connected to circuit node 54, an input connected to a voltage source path 94, and a control input 92 connected to control circuit 100.

Switch control circuit 100 serves to selectively simultaneously enable both of the switching means to enable the first stimulus voltage to be delivered to the circuit node and includes means for combining a BSR bit and a clock signal for producing a transmission gate control signal for the transmission gates associated with the voltage force and sense paths. In one embodiment, the combining means is in the form of AND gates 102 and 104. Gate 102 combines a BSR bit and a clock signal, HFclkd, for generating control signal 84 for transmission gate 82 associated with voltage sense path 62. Gate 104 combines a BSR bit and a clock signal, HFclk, for generating control signal 88 for transmission gate 86 associated with voltage force path 60. A clock signal, HFclkb, is applied to control input 92 of third transmission gate 90. It will be understood by those skilled in the art that other logic gates and/or circuits may be used to generate the transmission gate control signals. As described below, the control circuit may be controlled to stimulate circuit node 54 to either a low frequency or DC voltage or a high frequency voltage.

The above described circuit can be used for accurately delivering a voltage to a circuit node of an integrated circuit by sensing the voltage on the circuit node via a first bus under control of a first periodic signal, applying a first stimulus voltage to the circuit node via a second bus under control of a second periodic signal, applying a second stimulus voltage to the circuit node under control of a third periodic signal which is inverted with respect to the second periodic signal so that the circuit node is driven alternately to the first stimulus voltage and to the second stimulus voltage.

To stimulate circuit node 54 with a low frequency voltage, high frequency clocks HFclk and HFclkd are set to be continuously logic 1 to enable the force and sense paths, and HFclkb is set continuously to logic 0 to disable DC voltage (or low frequency signal) path 94. Circuit node 54 is accessed by shifting in BSR bits that enable force and sense path access switches 86 and 82, respectively, via AND gates 104 and 102. Thus, the low frequency stimulus voltage 18 is applied to an input of operational amplifier (op-amp) 26. The output of op-amp 26 forces circuit node 54 to stimulus voltage 18 via force path 60, based on negative feedback via sense path 62, regardless of the voltage drop across switch 86 caused by current flowing from the op-amp output through switch 86 to node 54 and impedance 55 to ground.

To stimulate a circuit node 54 with a high frequency voltage, periodic high frequency clock signals are applied to the HFclkd, HFclk, and HFclkb inputs. In general, the three clock signals have the same frequency—the frequency of the desired voltage signal to be applied to the circuit node. However, signal HFclkb is inverted relative to HFclk and its active time region is non-overlapping with respect to the active time region of HFclk so that the circuit node is never driven simultaneously by the force path 60 and DC voltage path 94.

Figure 5:
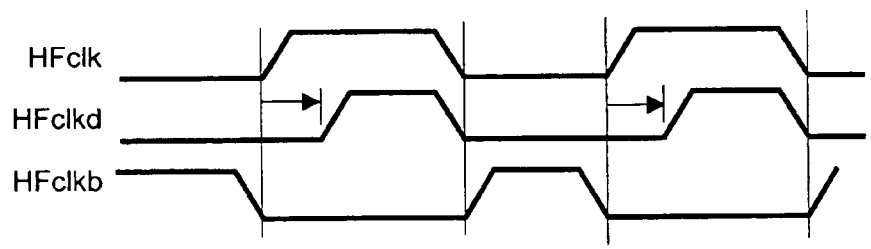
FIG. 5 illustrates clock waveforms of signals applied to high frequency clock inputs of the switch control circuit, according to a preferred embodiment of the present invention.

FIG. 5 shows preferred waveforms for HFclkd, HFclk, and HFclkb. As shown, HFclk is a force voltage clock signal having a frequency that is the desired stimulus frequency for the accessed circuit node. HFclkd is a sense voltage clock signal which is preferably timed so that its leading (rising) edge is delayed relative to the leading edge of HFclk, and its trailing (falling) edge is simultaneous with the corresponding edge of HFclk. The delayed leading edge ensures that sense feedback path 62 is not activated until force path 60 has had sufficient time to drive the circuit node to the present value of low frequency stimulus voltage 18. The trailing edges are simultaneous to ensure that the voltage present across capacitor 64 after the switches are deactivated is as equal as possible to the voltage that was present while the switches were enabled. Waveform HFclkb is inverted relative to the waveform HFclk, and its active time region is preferably non-overlapping with the active time region of HFclk, so that, as already mentioned, the circuit node is never driven simultaneously by the force path 60 and DC voltage path 94.

To stimulate a differential pair of circuit nodes, the circuitry of FIGS. 3 and 4 can be simply duplicated for each pin of the differential pair, so as to provide a pair of force paths and a pair of sense paths. Thus, the number of analog bus pins becomes four instead of the two described in the 1149.4 standard.

As previously mentioned, the present invention also seeks to provide signal delivery in a way that is compliant with the 1149.1 and 1149.4 test access standards. As the pin-count of new ICs increases each year, and the cost of high pin-count testers increases, it becomes necessary to consider reduced pin-count testing where only a small subset of an IC's pins are contacted during IC testing. The un-contacted pins are then tested via boundary scan circuitry that controls every pin. The preferred way, in industry, to implement digital boundary scan is according to the rules defined in the "IEEE Standard Test Access Port and Boundary-Scan Architecture", published in 1990 and 2001, by the Institute for Electrical and Electronic Engineers (IEEE), which is also known as IEEE Std. 1149.1-2001, or simply 1149.1. Another standard entitled "IEEE Standard for a Mixed Signal Test Bus", was published in 1999 by the IEEE, and is known as IEEE Std. 1149.4-1999, or simply 1149.4. The general architecture of an IC designed according to 1149.4 is shown in FIG. 6.

Figure 6:
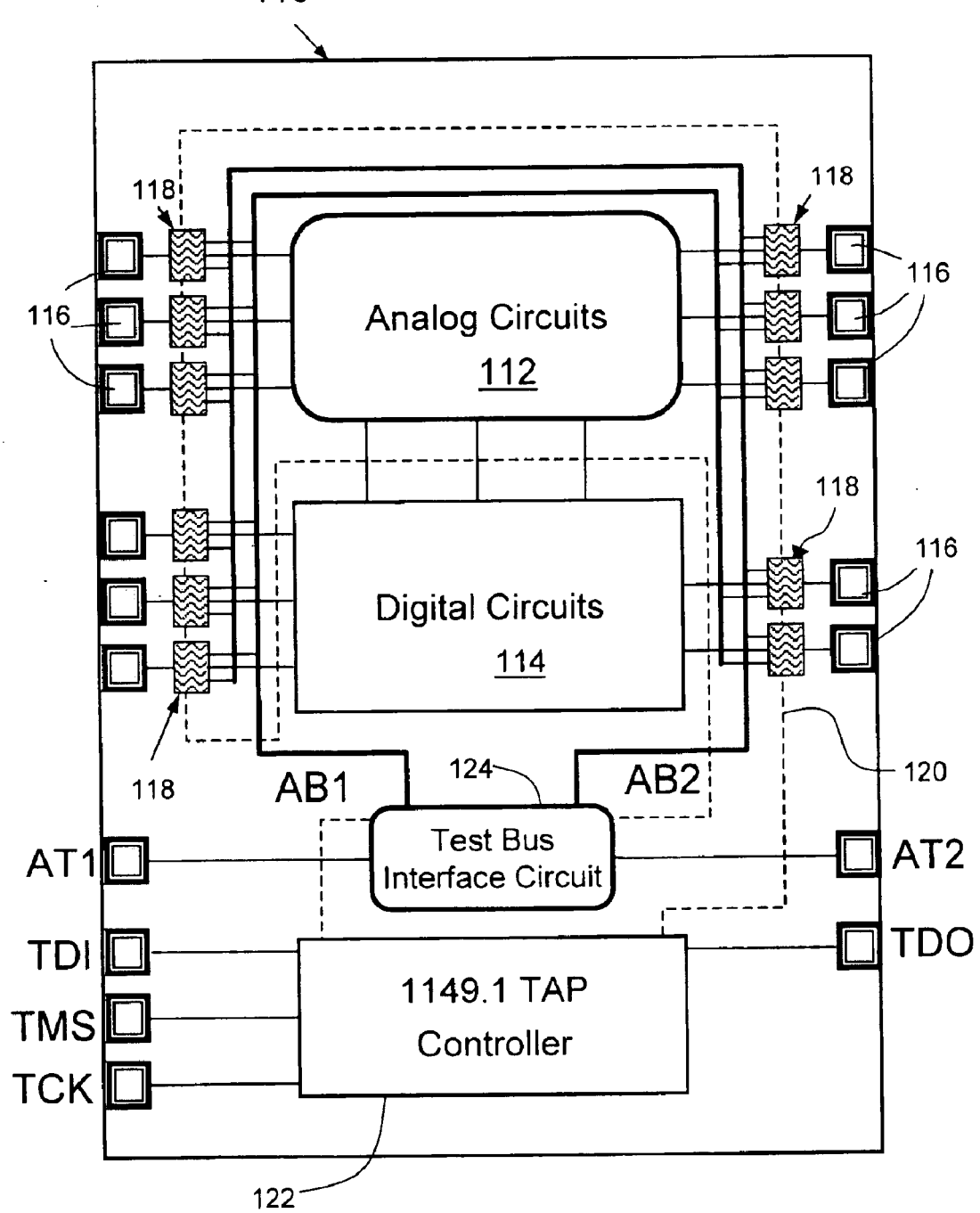
FIG. 6 is a prior art architecture of 1149.4-compliant IC.

FIG. 6 illustrates a circuit 110 having analog circuitry 112, digital circuitry 114 and input/output (I/O) pins 116. I/O pins 116 are associated with boundary scan cells or modules 118 which can be configured to form a shift register to allow data to be shifted into and out of the cells, along a shift path 120 between a test data input pin TDI and a test data output pin TDO, under control of a Test Access Port (TAP) controller 122. The circuit also includes a pair of analog buses AB1 and AB2 to each of which 1149.4 boundary scan modules can be selectively connected. The analog buses can be selectively connected to external buses via pins AT1 and AT2 under control of a Test Bus Interface circuit (TBIC) 124.

Figure 7:
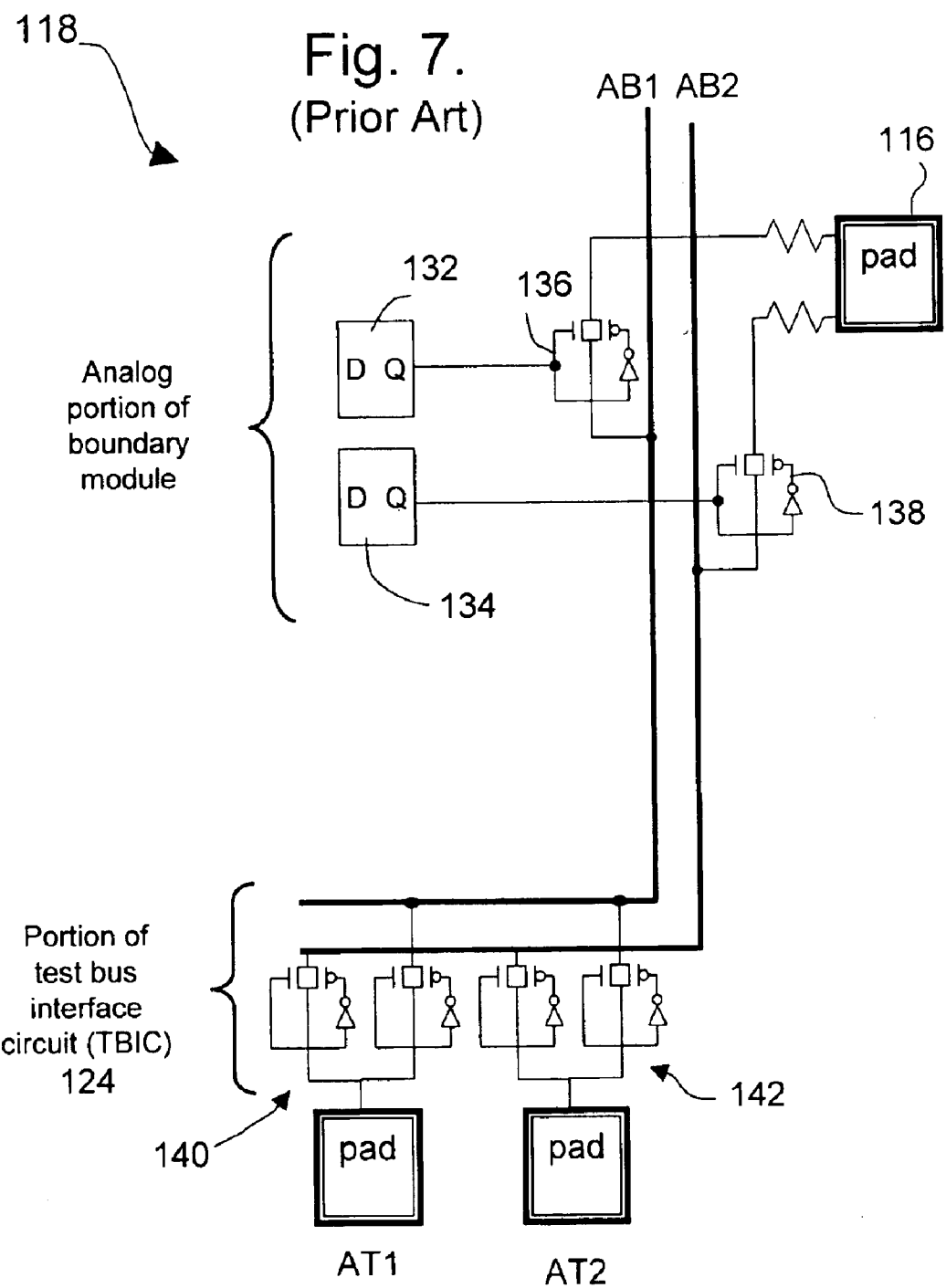
FIG. 7 is a prior art schematic of a typical 1149.4 boundary module and test bus interface circuit.

FIG. 7 illustrates related portions of an analog boundary module 118 and TBIC 124 associated with buses AB1 and AB2. The boundary scan modules include latches 132 and 134 whose contents control digitally controlled switches 136 and 138, respectively, each of which, in turn, connect one of the buses to the pad of pin 116 with which the nodule is associated. TBIC 124 also includes digitally controlled switches 140 and 142 which connect buses AB1 and AB2 to pins AT1 and AT2 as shown and as is well known in the art.

The capabilities of this test bus have been described in several published papers, including a paper entitled "Design, Fabrication, and Use of Mixed-Signal IC Testability Structures" by K. Parker et al, published in the Proceedings of the 1997 International Test Conference (ITC). This test bus was primarily designed to permit the measurement of discrete passive components, including capacitors and resistors, that are connected to the pins of ICs. It is intended for applying a stimulus current or voltage to a pin, via one of the test buses, and simultaneously monitoring the pin's response voltage via the other of the test buses, and to thus determine the impedance of a circuit that has been connected to the pin.

Figure 1:
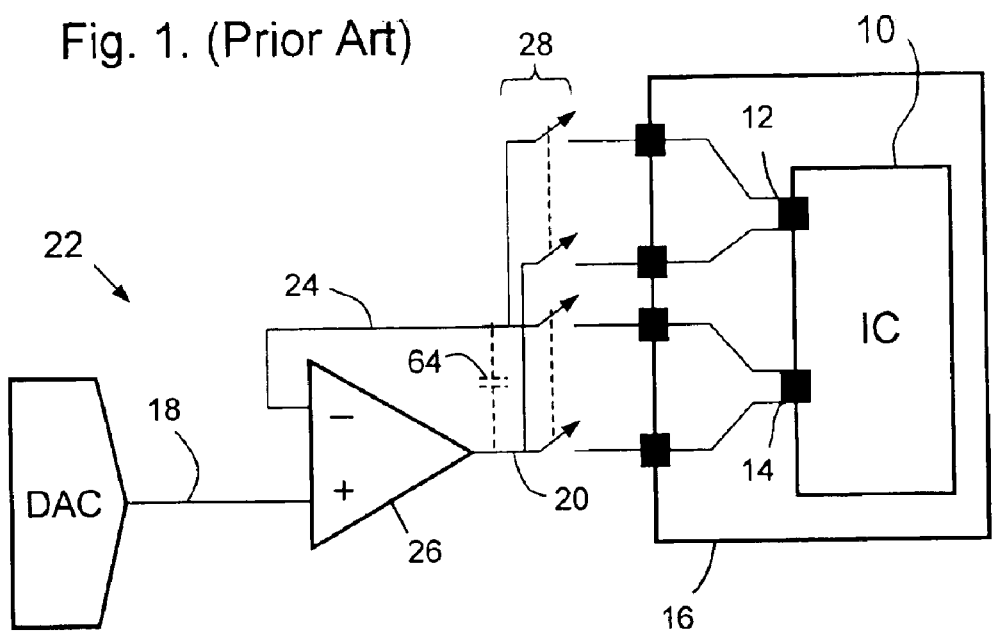
FIG. 1 is a prior art schematic of a tester stimulus signal source that has force/sense.
Figure 2:
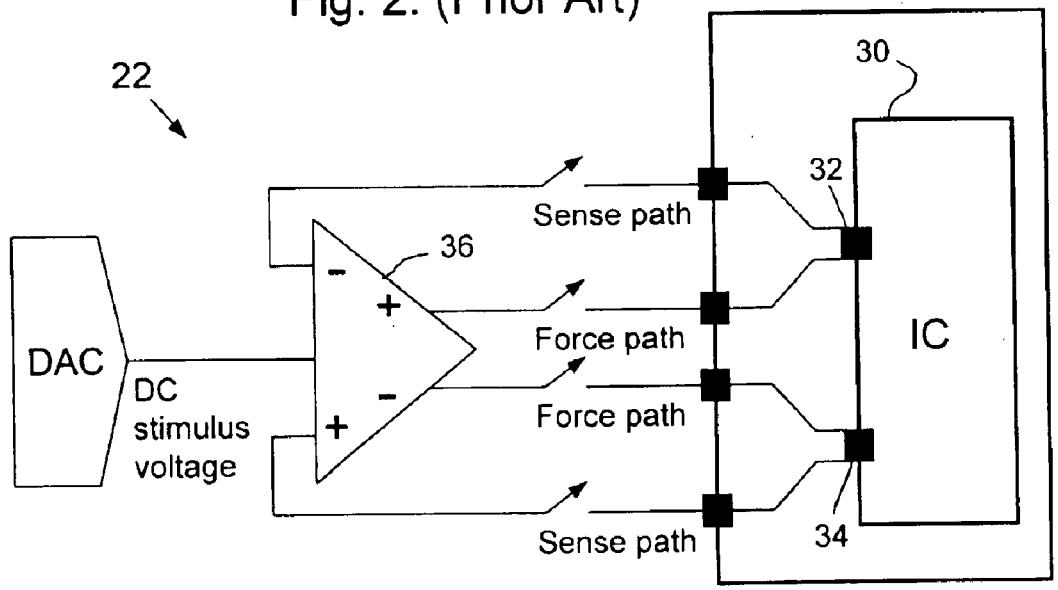
FIG. 2 is a prior art schematic of a tester stimulus signal source for differential pins and that has force/sense.
Figure 8:
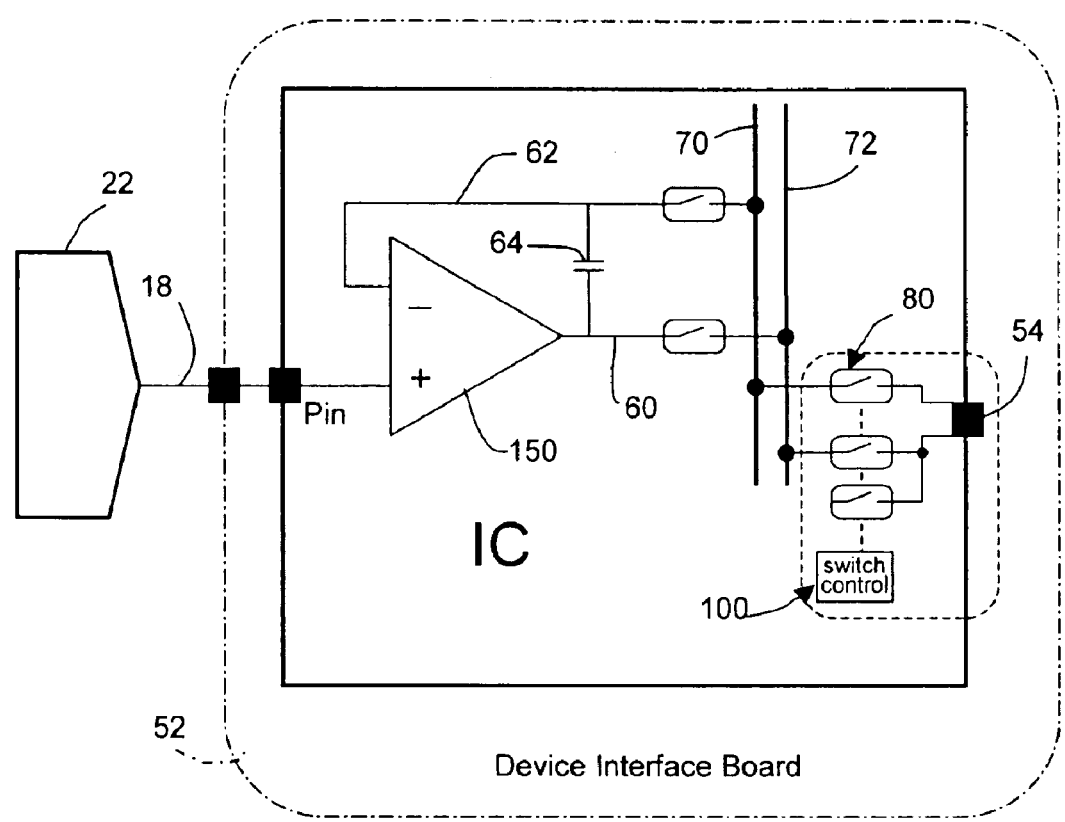
FIG. 8 is a schematic of a tester signal source connected to an IC that has two analog buses, and an on-chip force/sense operational amplifier, according to an embodiment of the invention.

Capacitor 64, shown in FIGS. 1, 3 and 8, may exist within the tester, on the device interface board, or within the IC. The capacitance value chosen is preferably based on the clock frequency and the frequency of the stimulus. For example, 50 pF is suitable for 100 MHz clocking and 10 kHz stimulus. A higher value of capacitance can be used for lower clock frequencies.

For clarity, only one accessed circuit node 54 has been shown in FIGS. 3, 6, 7 and 8. However, many circuit nodes may be connected to analog buses 70, 72. Similarly, the IC may contain many buses, especially if the access nodes have different voltage ranges or frequency ranges, or if there are a large number of circuit nodes to access. This is especially pertinent when the access nodes are pins of the IC.

In another embodiment of the invention, illustrated in FIG. 8, an op-amp 150 that provides the force/sense action is implemented into the IC that contains the accessed circuit node. This reduces the capacitance of the access buses considerably, and also permits a lower value feedback capacitance, both of which permit higher frequency operation.

Figure 9:
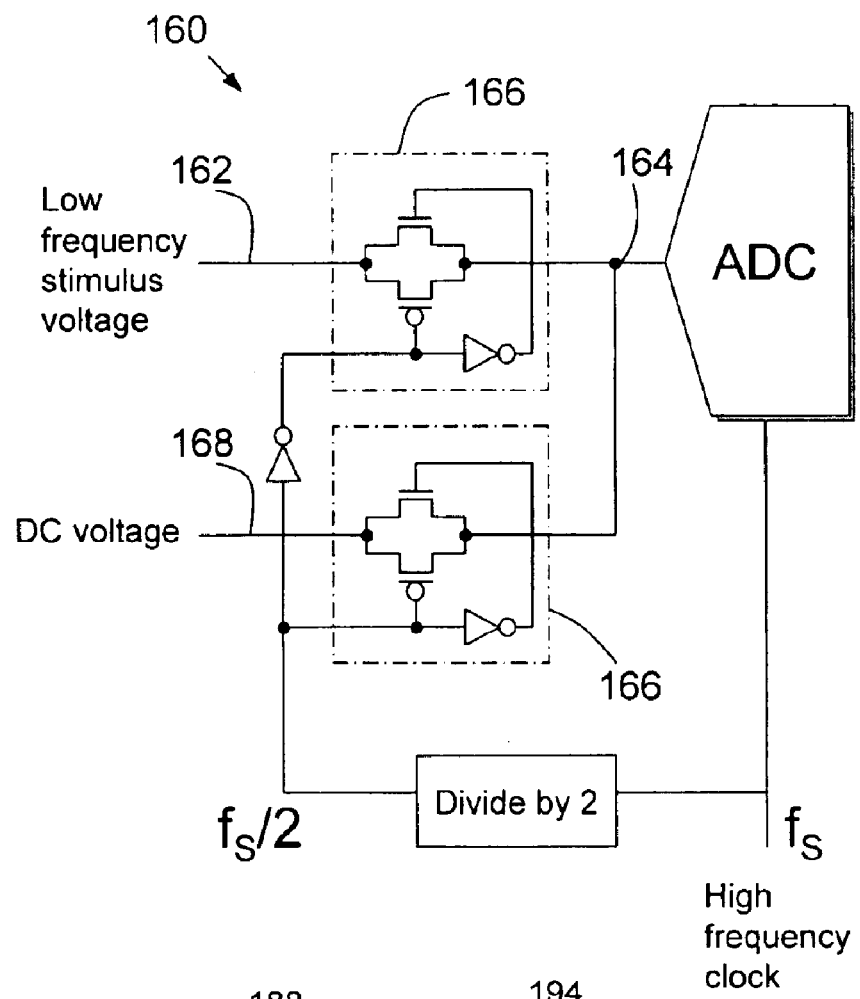
FIG. 9 is a schematic of a high frequency stimulus circuit that has a low frequency analog bus and high frequency switching at the circuit node under test.

The present invention is particularly useful when used in conjunction with the invention described and claimed in Applicant's U.S. Pat. No. 6,492,798 granted on Dec. 10, 2002 for "Method and Circuit for Testing High Frequency Mixed Signal Circuits with Low Frequency Signals", incorporated herein by reference. The patent describes a circuit and method of applying high frequency stimulus voltage to a circuit node. As shown in FIG. 9, circuit 160 conveys only a low frequency signal on an analog bus 162 to circuit node 164 and provides switching means 166 at the circuit node that switches between the voltage on bus 162 and the voltage of another low frequency signal (possibly DC) 168.

Figure 10:
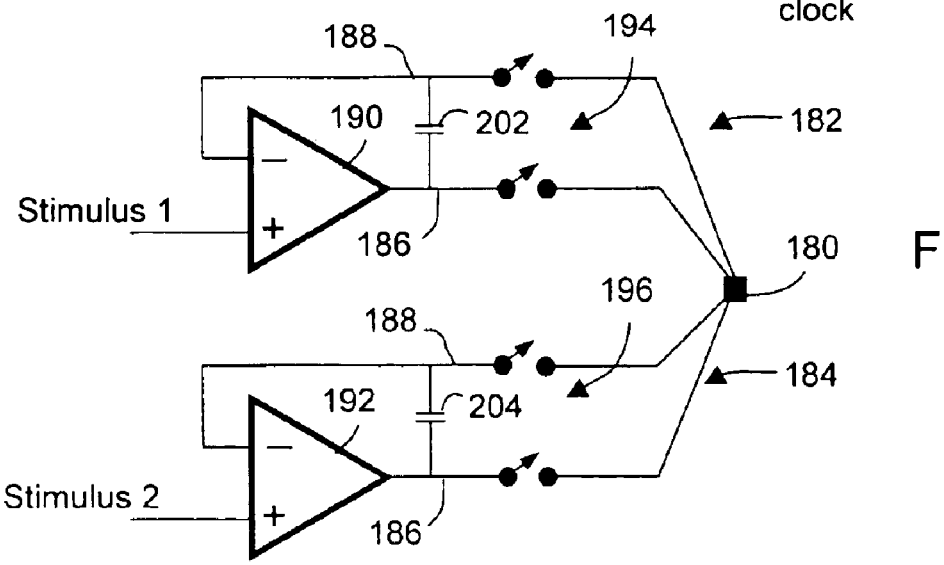
FIG. 10 is a schematic of a circuit for applying two stimulus signals to a circuit node of interest.

FIG. 10 schematically illustrates a circuit which may be employed to implement the method of testing high frequency mixed signal circuits with low frequency signals. FIG. 10 shows a circuit node 180 to which it is desired to apply two stimulus signals according to the invention described and claimed in the aforementioned application. The circuit includes two pairs of buses 182 and 184 which provide force/sense paths 186, 188 for each of the stimulus signals between the circuit node of interest and respective op-amps 190, 192, with each force/sense path having respective transmission gates 194, 196, and control circuits corresponding to transmission gates 80 and control circuits 100, respectively, described earlier. The force/sense paths include respective capacitors 202, 204 which serve as storage means for storing a voltage difference between the force voltage and the sense voltage. The op-amps and capacitors may both reside on chip, or one op-amp may reside on chip and other on a tester, or both may reside off chip.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A circuit for accurately delivering a first stimulus voltage to one or more circuit nodes of an IC, said circuit comprising:

first switching means, within the IC, for conveying a force voltage to one of said circuit nodes via a first pin of said IC;

second switching means, within the IC, for conveying a sense voltage from said one of said circuit nodes via a second pin of said IC;

amplifier means for adjusting said force voltage to cause said sense voltage to equal said stimulus voltage;

storage means for storing a voltage difference between the force voltage and the sense voltage; and means for selectively simultaneously enabling both of said switching means to enable said first stimulus voltage to be delivered to said one of said circuit nodes.

2. A circuit as defined in claim 1, further including third switching means for selectively applying a second stimulus voltage to said circuit node whenever the first stimulus voltage is not being delivered to said circuit node.

3. A circuit as defined in claim 1, each said switching means including transmission gates.

4. A circuit as defined in claim 1, each said switching means being selectively controlled by a periodic signal.

5. A circuit as defined in claim 4, said periodic signal for each of said switching means having different timing for rising and falling edges.

6. A circuit as defined in claim 1, said storage means being a capacitor.

7. A circuit as defined in claim 1, said integrated circuit having a scan register having a scan bit associated with said one of said circuit nodes, each said switching means enabled by the scan bit.

8. A circuit as defined in claim 1, said integrated circuit having a scan register having a scan bit associated with said one of said circuit nodes, each said switching means enabled by the scan bit and a periodic signal.

9. A circuit as defined in claim 2, further including second amplifier means for sensing and forcing said second stimulus voltage, and said switching means for selectively applying a second stimulus voltage including separate switching means for force and sense signal paths similar to the switching means for said first stimulus voltage.

10. A circuit for accurately delivering a stimulus voltage to one or more circuit nodes of an IC, said circuit comprising:

first switching means, within the IC, for conveying a force voltage to one of said circuit nodes;

second switching means, within the IC, for conveying a sense voltage from said one of said circuit nodes;

each said switching means being selectively controlled by a periodic signal;

amplifier means for adjusting said force voltage to cause said sense voltage to equal said stimulus voltage;

storage means for storing a voltage difference between the force voltage and the sense voltage; and means for selectively simultaneously enabling both of said switching means to enable said first stimulus voltage to be delivered to said one of said circuit nodes.

* * * * *